United States Patent
Hashimoto et al.

(10) Patent No.: US 9,788,445 B2
(45) Date of Patent: Oct. 10, 2017

(54) WATERPROOF ELECTRONIC EQUIPMENT UNIT

(71) Applicant: Mitsubishi Electric Corporation, Tokyo (JP)

(72) Inventors: Koji Hashimoto, Tokyo (JP); Shuichi Matsumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/194,642

(22) Filed: Jun. 28, 2016

(65) Prior Publication Data

US 2017/0238435 A1   Aug. 17, 2017

(30) Foreign Application Priority Data

Feb. 15, 2016 (JP) .................................. 2016-025544

(51) Int. Cl.
| | |
|---|---|
| H05K 5/00 | (2006.01) |
| H05K 5/06 | (2006.01) |
| H01R 12/72 | (2011.01) |
| H05K 7/20 | (2006.01) |

(52) U.S. Cl.
CPC ........... H05K 5/069 (2013.01); H01R 12/724 (2013.01); H05K 5/0052 (2013.01); H05K 7/20436 (2013.01)

(58) Field of Classification Search
CPC .. H05K 5/0069; H05K 5/0213; H05K 5/0052; H05K 7/20436
See application file for complete search history.

(56) References Cited

U.S. PATENT DOCUMENTS

| | | | | |
|---|---|---|---|---|
| 6,113,407 | A  * | 9/2000 | Martin ................ | H01R 13/521 439/205 |
| 6,827,232 | B1 * | 12/2004 | Hara ................ | B29C 45/14336 220/371 |
| 7,442,334 | B2 * | 10/2008 | Hara ................ | B29C 45/14639 264/241 |
| 7,667,973 | B2 * | 2/2010 | Shinoda ............... | H05K 5/0047 174/50 |
| 7,744,381 | B2 * | 6/2010 | Honda ................ | H05K 5/0052 439/79 |

(Continued)

FOREIGN PATENT DOCUMENTS

| | | |
|---|---|---|
| JP | 2013-004611 A | 1/2013 |
| JP | 2014-060307 A | 4/2014 |

*Primary Examiner* — Hoa C Nguyen
*Assistant Examiner* — Keith Depew
(74) *Attorney, Agent, or Firm* — Sughrue Mion, PLLC; Richard C. Turner

(57) ABSTRACT

A waterproof electronic equipment unit attached and fixed to a mounted surface having a flat mounting portion and depressed portion is reduced in size by effectively utilizing the depressed portion. A circuit substrate on which is mounted a connector housing is hermetically housed in a frame configured of a base and cover, the base includes a multiple of mounting legs fixed by screwing to a flat mounting portion, a base depressed portion disposed in a mounting surface depressed portion, and an inlet of a water-repellent filter opposing the flat mounting portion across a gap D1, and the connector housing and a high component are disposed in the base depressed portion.

7 Claims, 12 Drawing Sheets

(56) References Cited

U.S. PATENT DOCUMENTS

| | | | | |
|---|---|---|---|---|
| 7,936,566 B2* | 5/2011 | Shigyo | ............... | H05K 5/0052 |
| | | | | 137/14 |
| 8,014,158 B2* | 9/2011 | Kojima | ............... | H05K 5/0052 |
| | | | | 174/50.5 |
| 8,520,397 B2* | 8/2013 | Azumi | ............... | H05K 5/0052 |
| | | | | 361/730 |
| 8,627,564 B2* | 1/2014 | Blossfeld | ............ | H01R 13/6658 |
| | | | | 29/592.1 |
| 8,699,231 B2* | 4/2014 | Shinoda | ............... | H05K 5/0047 |
| | | | | 174/520 |
| 9,293,870 B1* | 3/2016 | Koczwara | ............ | H01R 12/724 |
| 9,462,715 B2* | 10/2016 | Nuriya | ................ | H05K 5/061 |
| 2007/0109730 A1* | 5/2007 | Shigyo | ............... | H05K 5/0052 |
| | | | | 361/600 |
| 2009/0129035 A1* | 5/2009 | Kojima | ............... | H05K 5/0052 |
| | | | | 361/752 |
| 2010/0124024 A1* | 5/2010 | Nishiuma | ......... | H05K 7/20481 |
| | | | | 361/705 |
| 2012/0069532 A1* | 3/2012 | Azumi | ............... | H05K 5/0052 |
| | | | | 361/752 |
| 2012/0320531 A1* | 12/2012 | Hashimoto | ......... | H05K 5/0052 |
| | | | | 361/720 |
| 2014/0076772 A1 | 3/2014 | Azumi et al. | | |
| 2015/0216070 A1* | 7/2015 | Nuriya | ............... | B32B 37/0076 |
| | | | | 361/752 |

* cited by examiner

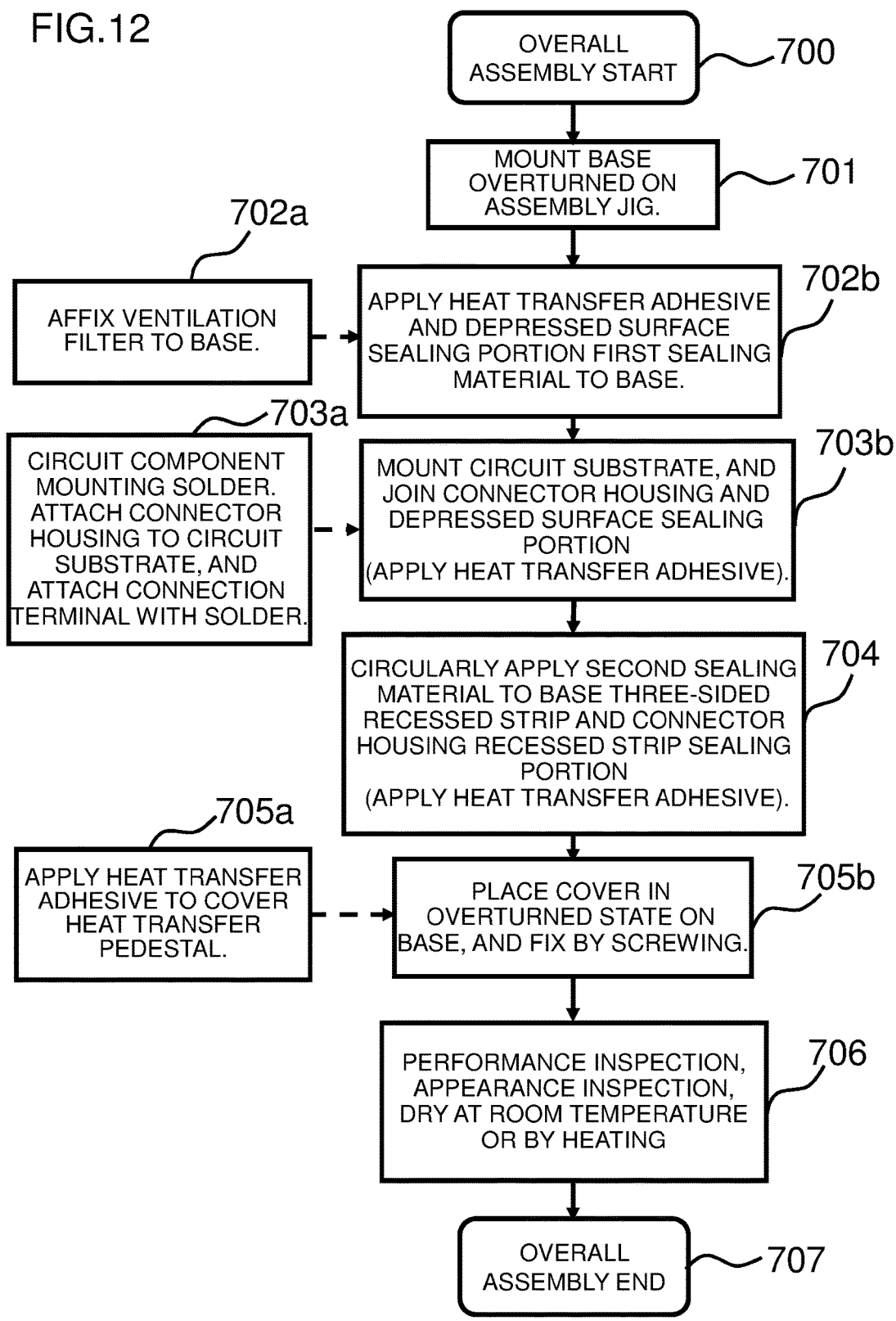

WATERPROOF ELECTRONIC EQUIPMENT UNIT

BACKGROUND OF THE INVENTION

1. Field of the Invention

The present invention relates to a waterproof electronic equipment unit suitable for installing directly in, for example, an automobile transmission gear box, and in particular, relates to a waterproof electronic equipment unit improved so as to be able to effectively utilize a given installation environment.

2. Description of the Related Art

Generally, there are two types of waterproof electronic equipment unit wherein a circuit substrate is hermetically housed inside a frame configured of a base and cover, circuit components including a heat generating component, and an external wiring connector housing of which one portion is exposed from the frame, are mounted on the circuit substrate, and a waterproof sealing material is applied to joining surfaces of the base, cover, and connector housing, the two types being a type wherein the connector housing, which forms a high component, is disposed between the circuit substrate and cover, and a type wherein the connector housing is disposed between the circuit substrate and base.

The base in this case is one portion of the frame on a side having mounting legs for disposing and fixing the electronic equipment unit to a mounted surface, and the frame is configured by the cover being, for example, fixed by screwing to the base.

Also, air inside the frame is released to the atmosphere by providing a water-repellent filter on an inner surface of the cover or base, so as to prevent deformation of the frame structure or damage to the hermetic sealing structure that is caused by a difference in atmospheric pressures inside and outside the frame due to a rise in the temperature of the heat generating component inside the frame.

The water-repellent filter is configured of a flat porous material including a multiple of minute holes that prevent water droplets from flowing into and passing through the interior of the frame and allow air to pass freely through, but the installation structure is devised so that the porous material is not contaminated by direct contact with water.

For example, according to FIG. 3 of Patent Document 1 "Electronic Control Device Substrate Housing Frame", a circuit substrate 40 on which is mounted a connector housing 41 is hermetically housed inside a substrate housing frame 10 configured of a base 30 and cover 20, mounting legs 32 are provided on the base 30 and disposed on and fixed to an unshown mounted surface, and the cover 20 is integrated with the base 30 by bent pieces provided at four corners being bent.

In Patent Document 1, the connector housing 41 is disposed between the circuit substrate 40 and cover 20, size is reduced by a high flat portion 22 and low flat portion 21 being provided on the cover 20, and heat generated by a heat generating component 43a is transferred to a heat transfer base portion of the base 30 by a heat transfer mechanism 12.

Also, according to FIGS. 1 and 2 of Patent Document 2 "Frame, and Method of Assembling the Frame", a circuit substrate 40A on which are mounted connector housings 24Aa and 24Ab is hermetically housed inside a substrate housing frame 10A configured of a case 20A, corresponding herein to a base, and cover 30A, mounting holes 21a to 21d are provided in mounting legs of the base (case) 20A and the mounting legs disposed on and fixed to an unshown mounted surface, and the cover 30A and base (case) 20A are integrated using four corner screws 31a to 31d and screw holes 22a to 22d of the base (case) 20A.

In Patent Document 2, the connector housings 24Aa and 24Ab are disposed between the circuit substrate 40A and base (case) 20A, and straight type connection pins 25a and 25b are force fitted into body portions of the connector housings 24Aa and 24Ab and connected by soldering to the circuit substrate 40A.

Also, heat generated by a heat generating component 42 is transferred to a heat transfer base portion of the base (case) 20A via a heat transfer conductor 43.

Patent Document 1: JP-A-2013-004611 (FIGS. 1 and 3, Abstract)

Patent Document 2: JP-A-2014-060307 (FIGS. 1, 2, and 4, Abstract)

1. Description of Problems with Existing Technology

The "Electronic Control Device Substrate Housing Frame" according to Patent Document 1 includes an advantage of increasing the capability of absorbing radiant heat emitted from a first substrate surface 43 side of the circuit substrate 40 using the low flat portion 21 of the cover 20, but the configuration is such that space on the exterior of the low flat portion 21 is not effectively utilized, and no reduction in the external dimensions of the overall frame can be expected.

Also, as heat generated by the heat generating component 43a is transferred to the base 30 side, there is a problem in that heat dissipating characteristics of the heat generating component 43a are disadvantageous when the base 30 side is of a higher temperature than the cover 20 side.

There is no discussion of an installation place of a water-repellent filter for protecting sealing materials 11a to 11c applied between the cover 20, base 30, and connector housing 41.

The "Frame, and Method of Assembling the Frame" according to Patent Document 2 provides a small, low-priced frame such that there is an improvement in waterproof sealing between the cover 30A and base (case) 20A configuring a frame in which a circuit substrate is hermetically housed, but as heat generated by the heat generating component 42 is transferred to the base (case) 20A side, heat dissipating characteristics of the heat generating component 42 are disadvantageous when the base (case) 20A side is of a higher temperature than the cover 30A side, and no advantage of transferring heat to the cover 30A can be expected. Instead, heat radiating fins 23A are provided neighboring the connector housings 24Aa and 24Ab, which are high components, and the overall configuration is large.

SUMMARY OF THE INVENTION

2. Description of Objects of the Invention

A first object of the invention is to provide a waterproof electronic equipment unit wherein a mounted surface that has a depressed portion wherein one portion of a flat mounting portion forms an idle space is such that the mounting surface depressed portion can be effectively utilized.

A second object of the invention is to provide a waterproof electronic equipment unit of a simple configuration such that an inlet of a water-repellent filter for carrying out respiration with external air is not indirect contact with water.

A waterproof electronic equipment unit according to the invention includes, with respect to a mounted surface including a flat mounting portion and mounting surface depressed portion, a base fixed by screwing to the flat mounting portion, a frame configured of the base and a metal cover, a circuit substrate hermetically housed in the frame, a resin connector housing, mounted on one side of the circuit substrate, of which one portion is exposed from an end face aperture of the frame, and a multiple of connection terminals fixed to a body portion of the connector housing, one end of the connection terminal being connected to a circuit pattern of the circuit substrate, and another end being in conductive contact with a connection terminal of a mating side connector, wherein the mounted surface, to which mounting legs provided on the base are fixed by screwing, has the mounting surface depressed portion in one region of the flat mounting portion, the base includes a base depressed portion fitted and disposed in the mounting surface depressed portion across a depressed portion gap D2, the connector housing, or the connector housing and a high component mounted on the circuit substrate, is disposed in the base depressed portion, an inlet of a water-repellent filter fixed to an inner surface of the base is provided in a non-depressed portion of the base, an outer plane of the inlet is disposed opposing the flat mounting portion across an intake surface gap D1, the water-repellent filter is of a flat porous material including a multiple of minute holes that allow air to pass freely through and prevent water droplets from flowing into and passing through an interior of the frame, a height dimension of the mounting legs when a depth of the mounting surface depressed portion is greater than a depth of the base depressed portion is set so as to be a value greater than a height of a flow of water flowing onto an outer surface of the base when carrying out a water exposure test in accordance with a predetermined specification as the intake surface gap D1, the height dimension of the mounting legs is determined so that an outer surface of the base depressed portion does not come into contact with the mounting surface depressed portion when the depth of the mounting surface depressed portion is smaller than the depth of the base depressed portion, and the inlet of the water-repellent filter is positioned higher in a vertical direction than a spatial region included in the mounting surface depressed portion.

As heretofore described, the waterproof electronic equipment unit according to the invention includes a frame disposed on and fixed to a mounted surface having a mounting surface depressed portion, the frame is configured of a base and cover housing a circuit substrate, the base includes abase depressed portion disposed in the mounting surface depressed portion, a high component including a connector housing mounted on the circuit substrate is disposed in the base depressed portion, a water-repellent filter is provided in a non-depressed portion of the base, and an inlet of the water-repellent filter is positioned above the mounting surface depressed portion.

Consequently, by disposing a high component including a connector housing utilizing a mounting surface depressed portion, there is an advantage in that the effective space occupied by an electronic equipment unit can be restricted.

Also, as the mounting surface depressed portion is not positioned above, it does not happen that the mounting surface depressed portion becomes a funnel and accumulated water flows into the inlet, and moreover, as the inlet of the water-repellent filter is positioned on the back surface of the electronic equipment unit, there is an advantage in that the inlet is unlikely to be directly exposed to water, there is no need to provide a mechanism preventing direct exposure to water on the periphery of the inlet, and the configuration is therefore small and low-priced.

The foregoing and other objects, features, aspects, and advantages of the invention will become more apparent from the following detailed description of the invention when taken in conjunction with the accompanying drawings.

BRIEF DESCRIPTION OF THE DRAWINGS

FIG. 12 is an assembly process diagram of the waterproof electronic equipment unit according to the first embodiment of the invention.

DETAILED DESCRIPTION OF THE PREFERRED EMBODIMENTS

First Embodiment

1. Detailed Description of Configuration

Figure 1:
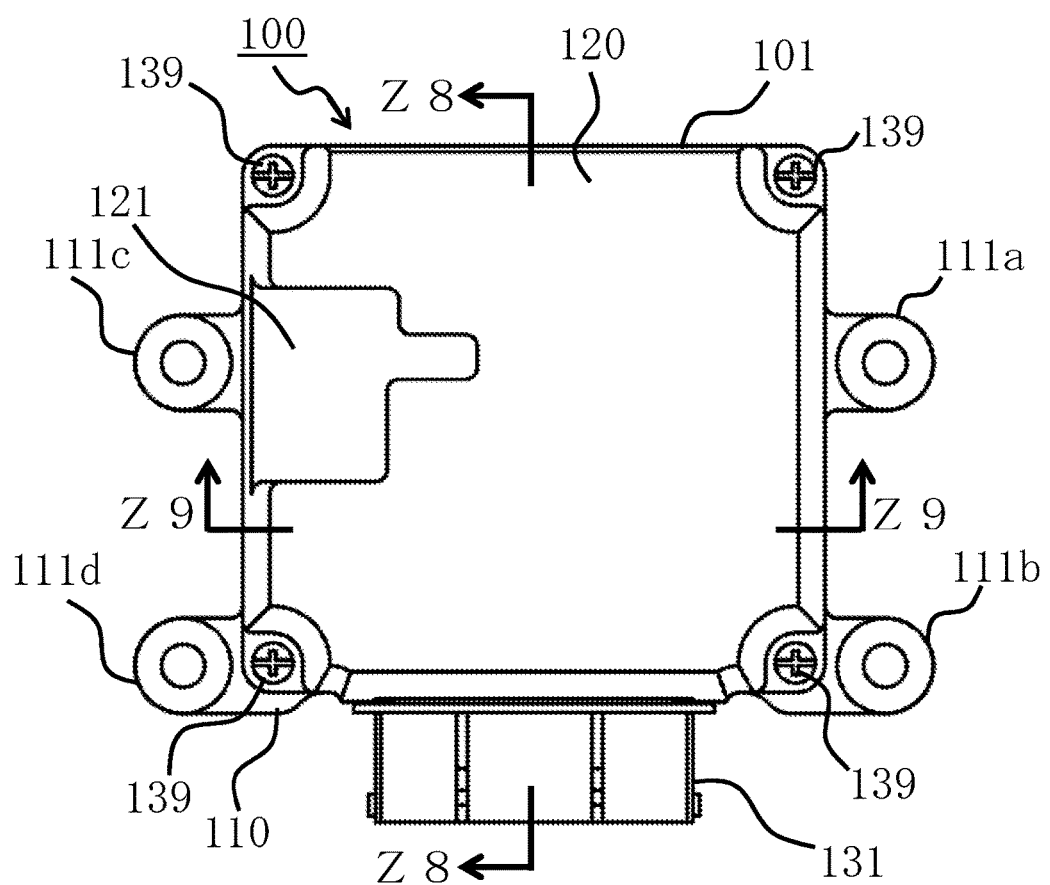
FIG. 1 is a top external view of a waterproof electronic equipment unit according to a first embodiment of the invention.
Figure 2:
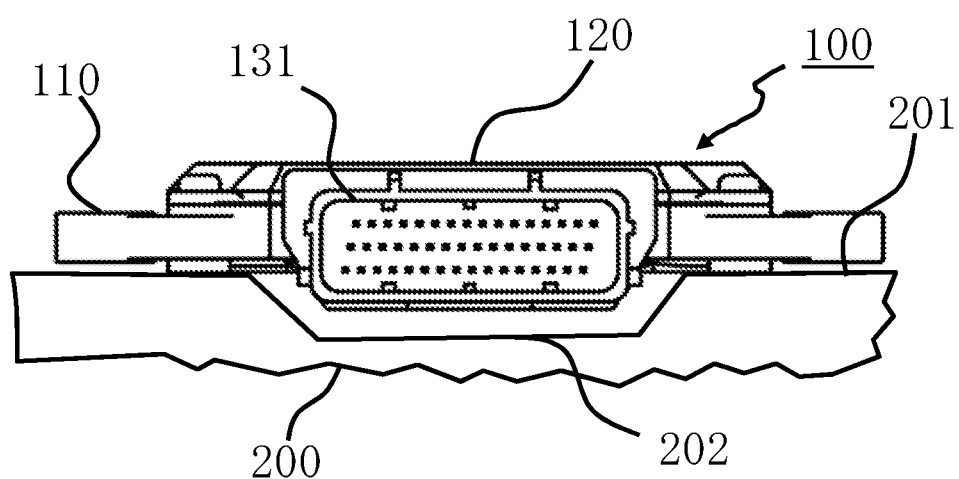
FIG. 2 is an end external view seen from a connector housing mounting surface side of FIG. 1.
Figure 3:
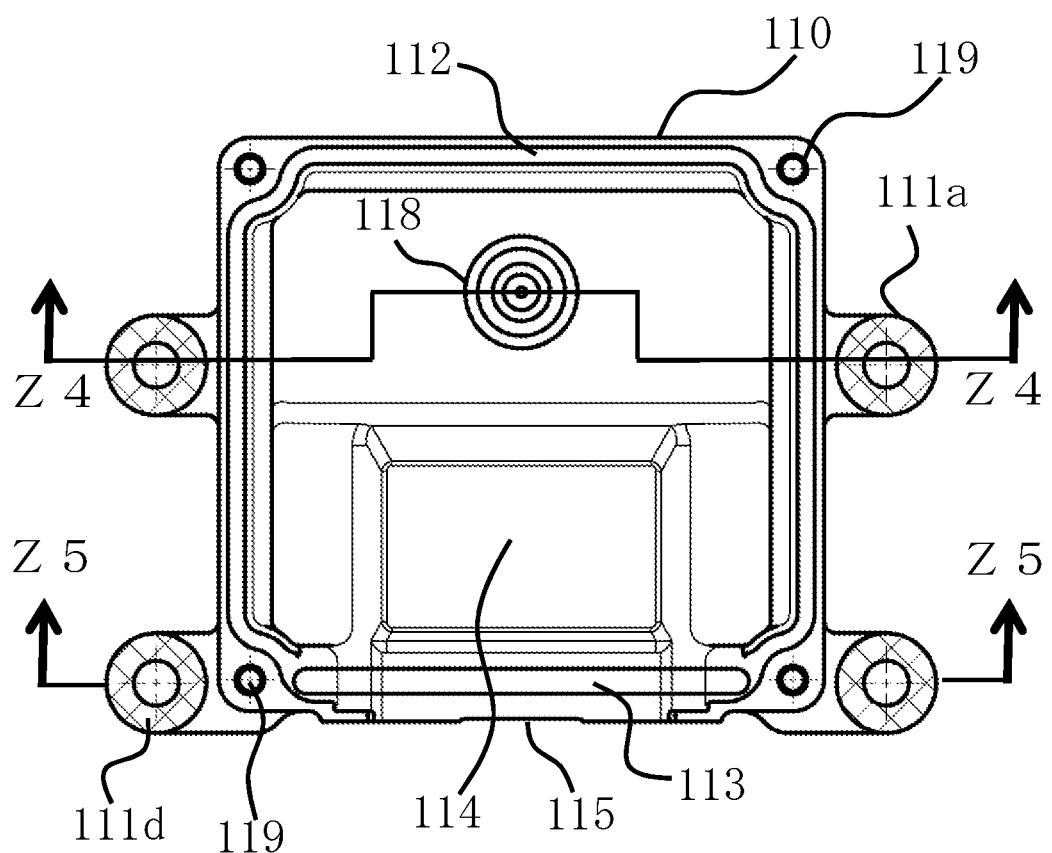
FIG. 3 is an internal plan view of a base of FIG. 1.
Figure 4:
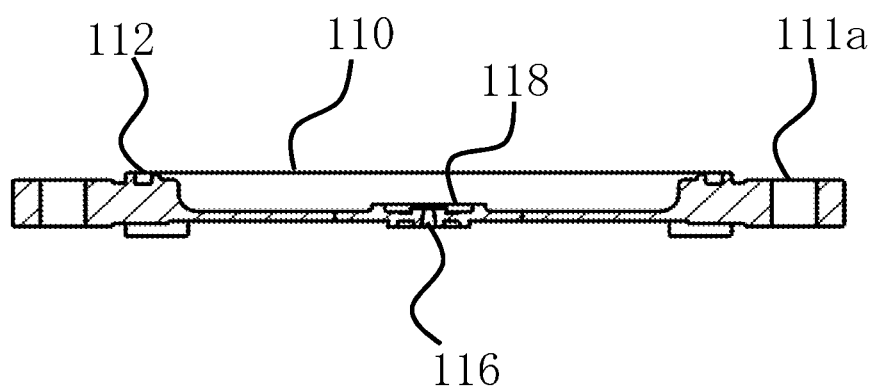
FIG. 4 is a sectional view along a Z4-Z4 line of FIG. 3.
Figure 5:
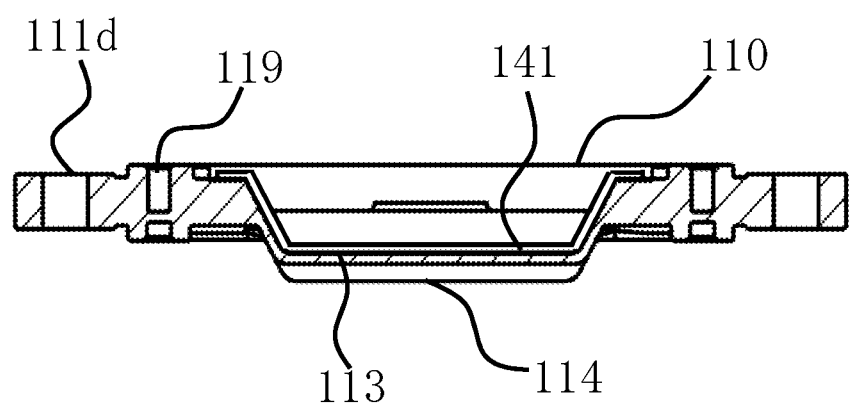
FIG. 5 is a sectional view along a Z5-Z5 line of FIG. 3.
Figure 6:
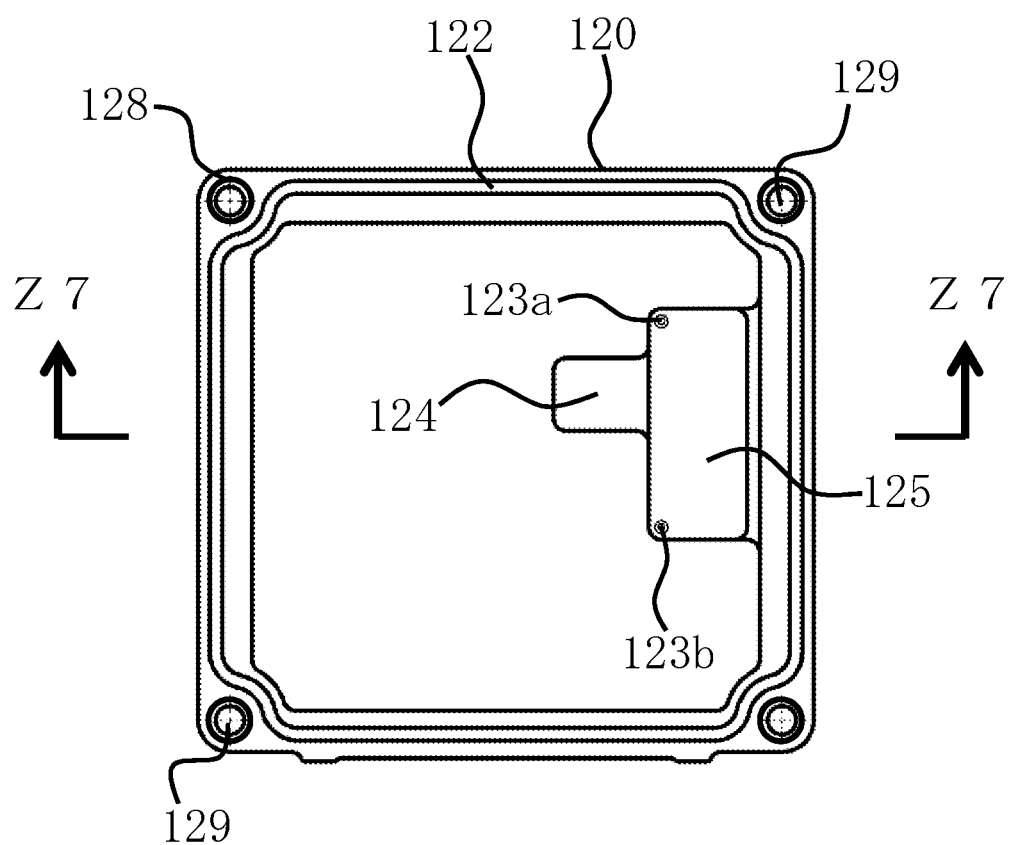
FIG. 6 is an internal plan view of a cover of FIG. 1.
Figure 7:
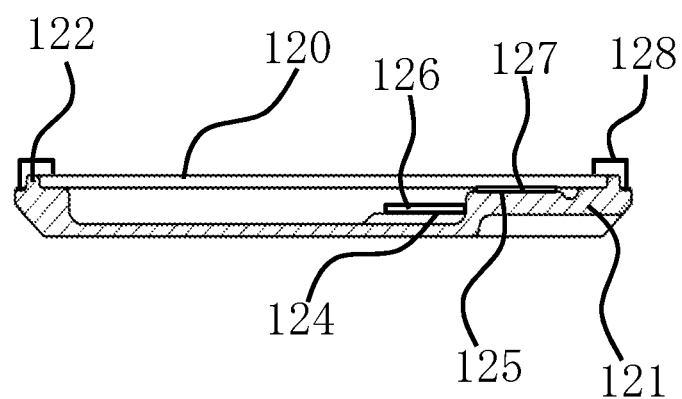
FIG. 7 is a sectional view along a Z7-Z7 line of FIG. 6.

Hereafter, FIG. 1, which is a top external view of a waterproof electronic equipment unit according to an embodiment of the invention, FIG. 2, which is an end external view seen from a connector housing mounting surface side of FIG. 1, FIG. 3, which is an internal plan view of a base of FIG. 1, FIG. 4, which is a sectional view along a Z4-Z4 line of FIG. 3, FIG. 5, which is a sectional view along a Z5-Z5 line of FIG. 3, FIG. 6, which is an internal plan view of a cover of FIG. 1, and FIG. 7, which is a sectional view along a Z7-Z7 line of FIG. 6, will be described sequentially.

Firstly, in FIGS. 1 and 2, which are unit external views, a waterproof electronic equipment unit 100 (hereafter sometimes referred to simply as the unit) is configured of a frame 101, wherein a base 110, made of die-cast aluminum or sheet metal or formed of thermosetting resin and having mounting legs 111*a* to 111*d* in four places, and a cover 120 made of die-cast aluminum or sheet metal are integrated using fastening screws 139 at four corners, and a circuit substrate 130 (refer to FIG. 8) housed in the frame, and one portion of a molded resin connector housing 131 mounted on one side of the circuit substrate 130 is exposed from an end face of the frame.

A cross-section of a body portion 132 (refer to FIG. 10) of the connector housing 131 is of a trapezoidal form, and an unshown mating side connector is inserted into the exposed portion of the connector housing 131 and connected to external equipment via a wire harness.

Also, the mounting legs 111*a* to 111*d* provided in the four places on the base 110 are disposed on and fixed to a flat mounting portion 201 of a mounted surface 200 using unshown fixing screws, but a mounting surface depressed portion 202, which is an idle space, is configured in one portion of the flat mounting portion 201.

Also, a heat transfer pedestal back surface portion 121 positioned on an outer surface of the cover 120 will be described hereafter using FIGS. 6 and 7.

In FIGS. 3 to 5, which show a detailed configuration of the base 110, screw holes 119 into which the fastening screws 139 described using FIG. 1 are screwed through the cover 120 are provided in the four corners of the base 110 that has the mounting legs 111a to 111d in the four places, and a three-sided recessed strip 112 is provided on three sides on the inner periphery of the screw holes 119.

A base depressed portion 114 provided in one region of a bottom surface of the base 110 configures an end face aperture 115 of the base 110, and a depressed surface sealing portion 113, into which the body portion 132 (refer to FIG. 10) of the connector housing 131 of FIG. 1 is fitted, is provided in the end face aperture 115.

The depressed surface sealing portion 113 is configured of a three-faced flat portion having trapezoidal inclined side portions and a short apex portion, a first sealing material 141 is applied to the flat portion, and the heat transfer coefficient of the sealing material is, for example, 0.18 W/mK or less.

A filter mounting surface 118 to which a water-repellent filter 117 (refer to FIG. 8) is affixed and fixed is provided on the inner side of a non-depressed surface of the base 110, and an intake surface of the water-repellent filter 117 communicates with external air via an inlet 116 provided in the base 110.

In FIGS. 6 and 7, which show a detailed configuration of the cover 120, clearance holes 129 through which the fastening screws 139 described using FIG. 1 are passed and fixed to the base 110 are provided in the four corners of the cover 120, and an annular projecting strip 122 is provided on four sides on the inner periphery of the clearance holes 129.

Tubular projecting portions 128 protrude on the outer peripheries of the clearance holes 129, and the thickness of a second sealing material 142 (refer to FIG. 12) to be described hereafter is determined by the height of the tubular projecting portions 128. Also, an intermediate stage heat transfer pedestal 124 and a high stage heat transfer pedestal 125 are provided on an inner bottom surface of the cover 120, first heat transfer adhesives 126 and 127 are applied to the heat transfer pedestals 124 and 125, and the first heat transfer adhesives 126 and 127 come into contact with a second heat generating component 136 and first heat generating component 135a to be described hereafter using FIG. 9. An adhesive with high thermal conductivity wherein the heat transfer coefficient exceeds, for example, 0.83 W/mK is used as the heat transfer adhesives.

Figure 9:
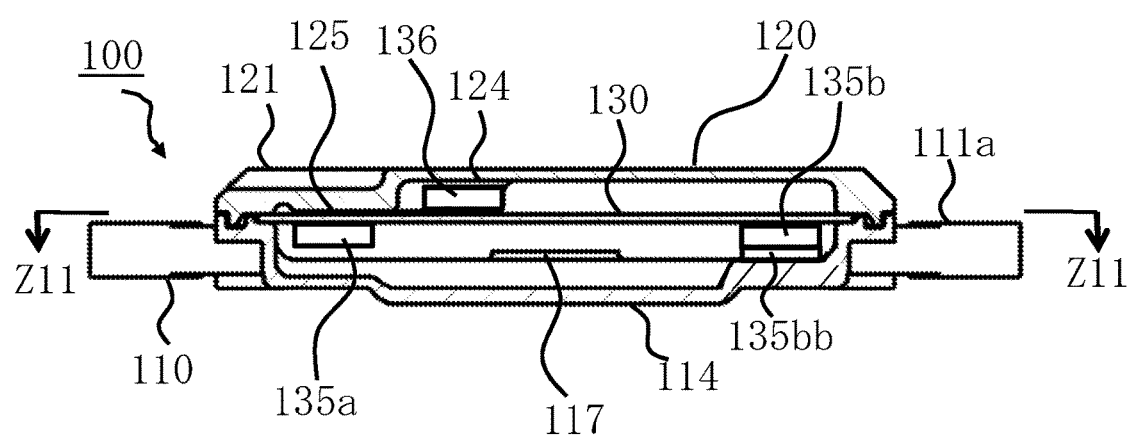
FIG. 9 is a sectional view along a Z9-Z9 line of FIG. 1.

A multiple of gap regulating projections 123a and 123b provided on the high stage heat transfer pedestal 125 are in contact with an insular pattern that does not communicate with a substrate surface or other circuit pattern on a back surface portion of the circuit substrate 130 shown in FIG. 9, and are for stably securing the applied thickness of the high stage first heat transfer adhesive 127.

Next, FIG. 8, which is a sectional view along a Z8-Z8 line of FIG. 1, FIG. 9, which is a sectional view along a Z9-Z9 line of FIG. 1, FIG. 10, which is an enlarged sectional view of the connector housing of FIG. 8, and FIG. 11, which is a sectional view along a Z11-Z11 line of FIG. 9, will be described sequentially.

Figure 8:
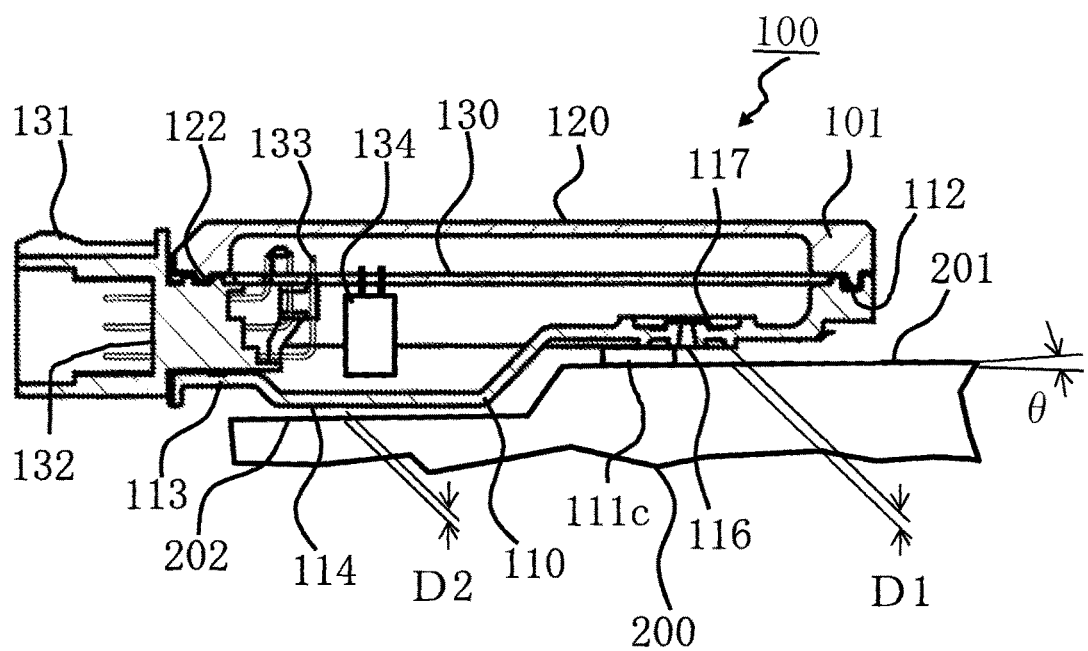
FIG. 8 is a sectional view along a Z8-Z8 line of FIG. 1.

In FIG. 8, which is a main sectional view of the unit, the waterproof electronic equipment unit 100 is configured of the frame 101, configured of the base 110 having the mounting legs 111a to 111d in the four places (only the mounting leg 111c is shown) and the cover 120, and the circuit substrate 130 housed in the frame, and one portion of the molded resin connector housing 131 mounted on one side of the circuit substrate 130 is exposed from an end face of the frame.

A multiple of right-angled connection terminals 133 are force fitted into the body portion 132 of the connector housing 131 molded from thermoplastic resin, and one end of each connection terminal 133 is soldered to one side of the circuit substrate 130.

Also, a soldered high component 134 mounted on the back surface of the circuit substrate 130, and the body portion 132 of the connector housing 131, are disposed in the base depressed portion 114.

The water-repellent filter 117 is affixed and fixed to the filter mounting surface 118 (refer to FIG. 3) provided on the inner side of the non-depressed surface of the base 110, and the intake surface of the water-repellent filter 117 communicates with external air via the inlet 116 provided in the base 110.

An aperture surface of the inlet 116 and the flat mounting portion 201 of the mounted surface 200 are opposed across an intake surface gap D1, and the intake surface gap D1 is of a dimension such that the inlet 116 is not blocked by water flowing onto the back surface of the base 110 when carrying out a water exposure test in accordance with predetermined specifications.

The flat mounting portion 201 has an angle of inclination θ with respect to the surface of the earth, and water flowing onto the back surface of the base flows in the direction of the base depressed portion 114.

The mounted surface 200 of the base 110 has the flat mounting portion 201 and mounting surface depressed portion 202, and the base depressed portion 114 of the base 110 is disposed in the mounting surface depressed portion 202, opposing the mounting surface depressed portion 202 across a depressed portion gap D2.

The dimensions of the intake surface gap D1 and depressed portion gap D2 are regulated in relation to the depth of the mounting surface depressed portion 202, the depth of the base depressed portion 114, and the height of the mounting legs 111a to 111d.

In FIG. 9, which shows a heat transfer mechanism of heat generating components, the first heat generating component 135a and a third heat generating component 135b are mounted on the back surface of the circuit substrate 130 opposing the base 110, and the second heat generating component 136 is mounted on a front surface of the circuit substrate 130 opposing the cover 120.

A back surface pattern of the first heat generating component 135a, to which an electrode terminal is connected, and a front surface pattern positioned on the opposite surface communicate via a plating through hole, and a transfer of heat between the front and back patterns is carried out.

The front surface pattern comes into heat transferring contact across the first heat transfer adhesive 127 (refer to FIG. 7) with the high stage heat transfer pedestal 125 provided on the inner surface of the cover 120.

A back surface (a surface opposite a soldered surface opposing the circuit substrate 130) of the second heat generating component 136 comes into heat transferring contact across the first heat transfer adhesive 126 (refer to FIG. 7) with the intermediate stage heat transfer pedestal 124 provided on the inner surface of the cover 120 (or with the inner bottom surface of the cover 120).

A back surface (a surface opposite a soldered surface opposing the circuit substrate 130) of the third heat generating component 135*b* comes into heat transferring contact across a second heat transfer adhesive 135*bb* with a pedestal surface provided on the inner surface of the base 110 (or with an inner bottom surface of the base 110).

Figure 10:
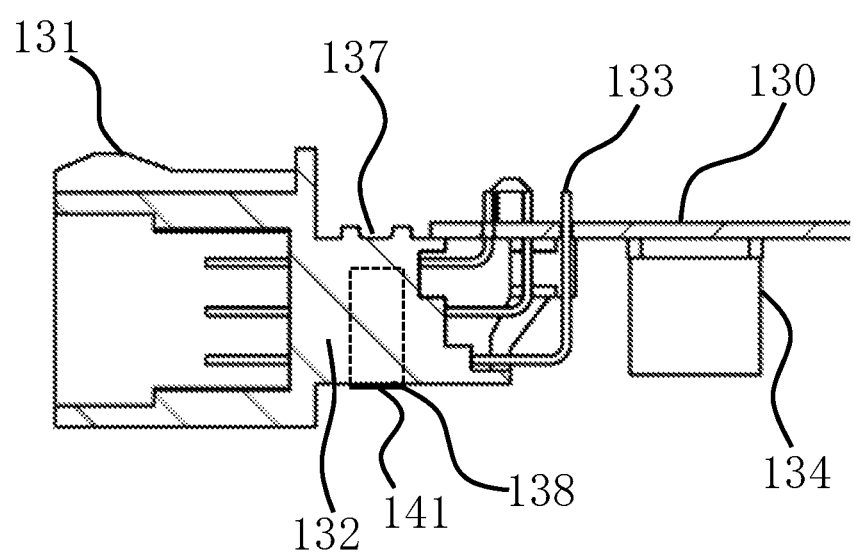
FIG. 10 is an enlarged sectional view of a connector housing of FIG. 8.

In FIG. 10, which shows a detailed configuration of the connector housing, the multiple of right-angled connection terminals 133 force fitted into the body portion 132 of the connector housing 131 are such that one end thereof is soldered to one side of the circuit substrate 130.

A cross-section of the body portion 132 is of a trapezoidal form, wherein the three faces of the trapezoidal inclined side portions and short apex portion configure a flat sealing portion 138, and come into contact across the first sealing material 141 with the depressed surface sealing portion 113 of the base 110 shown in FIG. 5.

Also, a recessed strip sealing portion 137 is provided in a long bottom side portion of the body portion 132, and the recessed strip sealing portion 137 and the three-sided recessed strip 112 of the base 110 shown in FIG. 3 communicate with each other, thereby generating an annular recessed strip 140.

When the circuit substrate 130 on which the connector housing 131 is mounted is placed on a three-sided shelf portion of the base 110 in FIG. 6, which shows a configuration of an annular sealing surface, the annular recessed strip 140 is configured by the three-sided recessed strip 112 of the base 110 shown in FIGS. 3 and 4 and the recessed strip sealing portion 137 of the connector housing 130 shown in FIG. 10, and the second sealing material 142 is applied circularly to the annular recessed strip.

Further, a state wherein the annular projecting strip 122 of the cover 120 shown in FIGS. 6 and 7 is fitted into the annular recessed strip 140 is shown in FIG. 8.

As previously described using FIGS. 7 and 9, the first heat transfer adhesive 127 is applied to a substrate surface corresponding with the first heat generating component 135*a* provided on the back surface of the circuit substrate 130 or to the heat transfer pedestal 125 of the opposing cover 120, and the first heat transfer adhesive 126 is applied to the back surface of the second heat generating component 136 provided on the front surface of the circuit substrate 130 or to the heat transfer pedestal 124 of the opposing cover 120.

Also, the second heat transfer adhesive 135*bb* corresponding with the back surface of the third heat generating component 135*b* provided on the back surface of the circuit substrate 130 is applied to the heat transfer pedestal of the base 110.

2. Detailed Description of Assembly Method

Next, a detailed description will be given of FIG. 12, which is an assembly process diagram of the waterproof electronic equipment unit 100.

In FIG. 12, a step 700 is a step of starting an operation of assembling the waterproof electronic equipment unit 100. A following step 701 is a step of mounting the base 110 on an assembly jig with the inner surface of the base 110 facing the ceiling.

A following step 702*b* is a first processing step of applying the paste form first sealing material 141 (refer to FIG. 5) in planar form to the depressed surface sealing portion 113 of base 110 and applying the second heat transfer adhesive 135*bb* (refer to FIG. 9) to the inner bottom surface of the base 110, but prior to step 702*b*, the water-repellent filter 117 is affixed and fixed to the filter mounting surface 118 (refer to FIG. 3) of the base 110 in a preliminary processing step 702*a*.

A step 703*b* following step 702*b* is a second processing step of mounting a "circuit substrate intermediate assembled body" finished in a preparatory step 703*a* preceding step 703*b* on shelf portions provided in three places on the base 110, and joining the first sealing material 141 applied in step 702*b* and the body portion 132 of the connector housing 131.

Preparatory step 703*a* is a step in which the first to third heat generating components 135*a*, 136, and 135*b* and many other circuit components are mounted on the circuit substrate 130 and soldering carried out, and in which one end of the connection terminal 133 is soldered to a land provided on the circuit substrate 130, thereby finishing the "circuit substrate intermediate assembled body".

Figure 11:
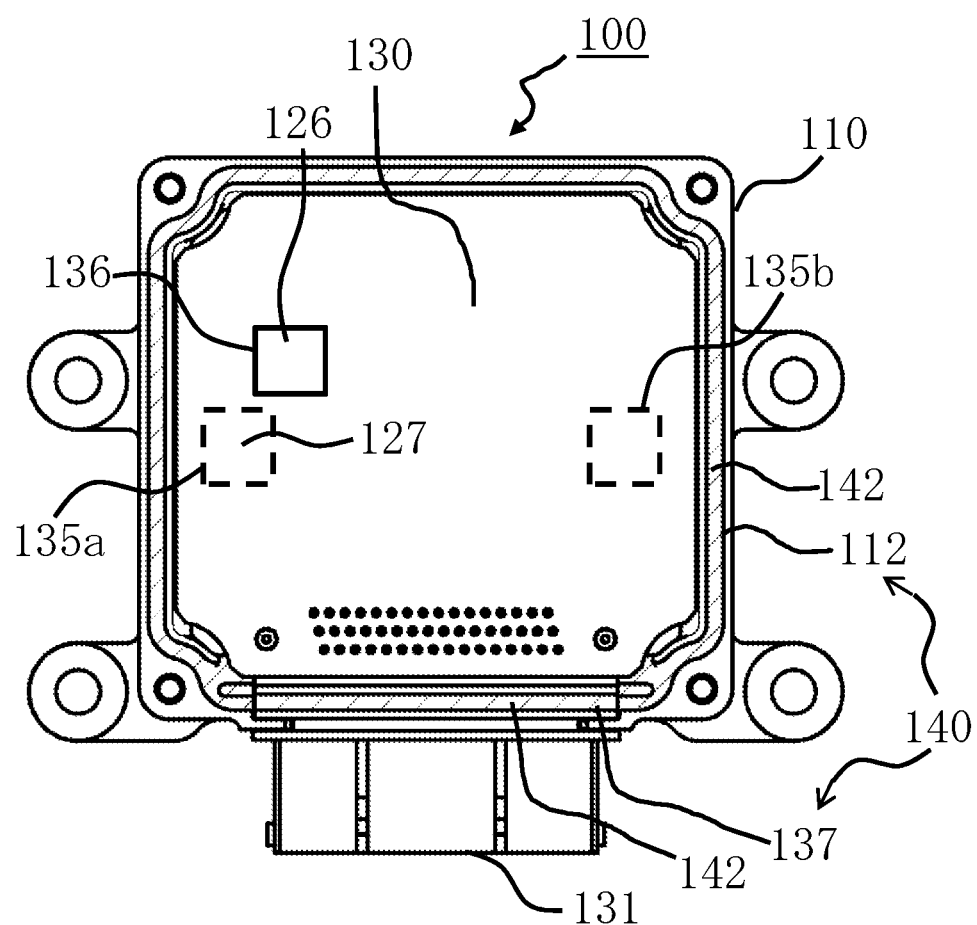
FIG. 11 is a sectional view along a Z11-Z11 line of FIG. 9.

A step 704 following step 703*b* is a third processing step of applying the paste form second sealing material 142 circularly to the annular recessed strip configured by the three-sided recessed strip 112 neighboring further to the outer side than the shelf portion of the base 110 and the recessed strip sealing portion 137 of the connector housing 130 (refer to FIG. 11). A following step 705*b* is a fourth processing step of mounting the cover 120, to which the first heat transfer adhesives 126 and 127 (refer to FIG. 7) are applied in a preparatory step 705*a* preceding step 705*b*, on the base 110 in an overturned state, joining the second sealing material 142 and first heat transfer adhesives 126 and 127 applied in step 704 and step 705*a* to mating surfaces, and integrally fixing the cover 120 and base 110 using the fastening screws 139 (refer to FIG. 1).

Instead of the operation of applying the first heat transfer adhesives 126 and 127 to the cover 120 in preparatory step 705*a*, the first heat transfer adhesives 126 and 127 can be applied to the opposite surface of the circuit substrate 130 on which the first heat generating component 135*a* is mounted and a back surface portion of the second heat generating component 136 in step 704 or step 703*b* (refer to FIG. 11).

A step 706 following step 705*b* is a step of carrying out initial settings, a performance inspection, and an appearance inspection of the waterproof electronic equipment unit 100, while the first heat transfer adhesives 126 and 127, second heat transfer adhesive 135*bb*, and first and second sealing materials 141 and 142 applied in step 702*b* and step 705*a*, or in step 704 or step 703*b*, are dried at room temperature or dried by heating, after which a shift is made to an overall assembly completion step 707.

In the above description, a maximum value of an ambient surface temperature of the cover 120 is assumed to be a low ambient temperature equal to or lower than a maximum ambient temperature of the mounted surface 200, and heat generated by the heat generating components being transferred to the cover 120 side is more advantageous than the heat being transferred to the base 110 side.

Also, in order to restrict heat from the high temperature side base 110 being transferred to the low temperature cover 120 side, it is desirable that the second sealing material 142 is a material with low thermal conductivity, and that an adhesive of a material with a different thermal conductivity is applied for the first heat transfer adhesives 126 and 127, of which high thermal conductivity is required.

The third heat generating component 135*b* (refer to FIG. 9) is such that, even when the base 110 side is of a higher temperature than the cover 120 side, the temperature of the third heat generating component 135*b*, which opposes and neighbors the base 110 and whose ambient temperature is high, becomes higher still due to a rise in the temperature of the third heat generating component 135b itself being added, because of which transferring heat to the base 110 via the second heat transfer adhesive 135bb can restrict temperature rise more than when heat is not transferred.

Also, even when an unshown fourth heat generating component is mounted on the front surface side of the circuit substrate 130, which opposes the cover 120, a front surface pattern of the fourth heat generating component, to which an electrode terminal is connected, and a back surface pattern positioned on the opposite surface communicate via a plating through hole, and a transfer of heat between the front and back patterns is carried out, the back surface pattern can be brought into heat transferring contact with a heat transfer pedestal provided on the inner surface of the base 110 across a thermally conductive adhesive.

Note that when a molded article using a highly heat resistant thermosetting resin is adopted as the base 110 instead of using a metal material made of die-cast aluminum or sheet metal, there is a characteristic such that transfer of heat from the base 110 side to the cover 120 side can be considerably restricted, in which case no advantage is obtained by applying a heat transfer adhesive to a heat transfer pedestal corresponding to the third heat generating component 135b or fourth heat generating component.

3. Main Points and Characteristics of Embodiment

As is clear from the above description, the waterproof electronic equipment unit according to the first embodiment of the invention is the waterproof electronic equipment unit 100 including, with respect to the mounted surface 200 including the flat mounting portion 201 and mounting surface depressed portion 202, the base 110 fixed by screwing to the flat mounting portion 201, the frame 101 configured of the base and the metal cover 120, the circuit substrate 130 hermetically housed in the frame, the resin connector housing 131, mounted on one side of the circuit substrate, of which one portion is exposed from the end face aperture 115 of the frame 101, and the multiple of connection terminals 133 fixed to the body portion 132 of the connector housing, one end of the connection terminal is connected to a circuit pattern of the circuit substrate 130, and the other end is in conductive contact with a connection terminal of a mating side connector, wherein the mounted surface 200, to which the mounting legs 111a to 111d provided on the base 110 are fixed by screwing, has the mounting surface depressed portion 202 in one region of the flat mounting portion 201, and the base 110 includes the base depressed portion 114 fitted and disposed in the mounting surface depressed portion 202 across the depressed portion gap D2.

Further, the connector housing 131, or the connector housing 131 and the high component 134 mounted on the circuit substrate 130, is disposed in the base depressed portion 114, the inlet 116 of the water-repellent filter 117 fixed to the inner surface of the base 110 is provided in the non-depressed portion of the base 110, the outer plane of the inlet is disposed opposing the flat mounting portion 201 across the intake surface gap D1, the water-repellent filter 117 is of a flat porous material including a multiple of minute holes that allow air to pass freely through and prevent water droplets from flowing into and passing through the interior of the frame 101, the height dimension of the mounting legs 111a to 111d when the depth of the mounting surface depressed portion 202 is greater than the depth of the base depressed portion 114 is set so as to be a value greater than the height of a flow of water flowing onto the outer surface of the base 110 when carrying out a water exposure test in accordance with a predetermined specification as the intake surface gap D1, the height dimension of the mounting legs 111a to 111d is determined so that the outer surface of the base depressed portion 114 does not come into contact with the mounting surface depressed portion 202 when the depth of the mounting surface depressed portion 202 is smaller than the depth of the base depressed portion 114, and the inlet 116 of the water-repellent filter 117 is positioned higher in a vertical direction than a spatial region included in the mounting surface depressed portion 202.

When the mounting legs 111a to 111d of the base 110 are attached and fixed onto the mounted surface 200, which forms a floor surface, the angle of inclination θ is provided for the flat mounting portion 201, and the angle of inclination θ is an angle inclined in a direction such that water flowing into a gap between the back surface of the base 110 and the flat mounting portion 201 flows in the direction of the mounting surface depressed portion 202.

As heretofore described, in connection with claim 2 of the invention, an angle of inclination is provided for the flat mounting portion so that water flowing into a gap between the back surface of the waterproof electronic equipment unit and the flat mounting portion flows in the direction of the connector housing.

Consequently, there are characteristics such that the inlet of the water-repellent filter is prevented from being blocked by an accumulation of water on the flat mounting portion, and damage to a hermetic sealing member can be prevented without impeding respiration of external air owing to temperature change inside the frame.

The three-sided recessed strip 112 is provided on three sides of an outer peripheral portion of the inner surface of the base 110, the depressed surface sealing portion 113 to which the first sealing material 141 is applied is provided in the end face aperture 115 in which inclined sides and a short apex of a trapezoidal form are configured by the base depressed portion 114, one end of the multiple of connection terminals 133 fixed to the body portion 132 of the connector housing 131 is bent at a right angle and connected to the circuit pattern of the circuit substrate 130, the three-sided flat sealing portion 138 configuring the two inclined sides and a short apex of a trapezoidal form fitted into the end face aperture 115, and the recessed strip sealing portion 137 provided in a long bottom side of the trapezoidal form, are configured on the outer peripheral surface of the body portion 132, the annular projecting strip 122 is provided on four sides on an outer peripheral portion of the inner surface of the cover 120, the annular recessed strip 140 to which the second sealing material 142 is circularly applied is configured by the three-sided recessed strip 112 and recessed strip sealing portion 137, and the annular projecting strip 122 is fitted into the annular recessed strip.

As heretofore described, in connection with claim 3 of the invention, the end face aperture of the base and the end face form of the connector housing form three faces formed of trapezoidal inclined sides and a short apex to which the first sealing material is applied, the long bottom side of the connector housing and three sides of the base configure an annular recessed strip to which the second sealing material is applied, and the annular projecting strip of the cover is fitted into the annular recessed strip.

Consequently, while the recessed strip sealing portion is provided in the long bottom side of the connector housing whose body dimension becomes shorter as the connector housing nears the circuit substrate, whereby shortening of a sealing path (water ingress path) is carried out, the body dimension of the remaining three trapezoidal sides enclosing the bent connection terminals lengthens, because of which there are characteristics such that a sufficient sealing path can be secured even with a flat sealing portion, without adopting an irregular sealing surface, whereby the height dimension of the connector housing is restricted, and the base depressed portion can be disposed even when the depth of the mounted surface depression is small.

The cover 120 is molded from a conductive metal material or processed from sheet metal, one or both of the back surface side first heat generating component 135*a* and front surface side second heat generating component 136 are mounted on the circuit substrate 130, the first heat generating component 135*a* is mounted on the substrate back surface opposing the base 110, heat generated by this heat generating component is transferred to the high stage heat transfer pedestal 125 provided on the cover 120 via a substrate front surface side flat surface pattern linked by a plating through hole provided in the circuit substrate 130, the second heat generating component 136 is mounted on the substrate front surface opposing the cover 120, heat generated by this heat generating component is transferred to the inner surface of the cover 120 or to the intermediate stage heat transfer pedestal 124, the silicone resin series first heat transfer adhesives 126 and 127 including a conductive material are applied to the intermediate stage or high stage heat transfer pedestal 124 or 125, and the maximum value of the ambient surface temperature of the cover 120 is equal to or lower than the maximum ambient temperature of the mounted surface 200.

As heretofore described, in connection with claim 4 of the invention, heat generated by the heat generating component mounted on the front surface side or back surface side of the circuit substrate is transferred to the inner surface of the cover made of a metal material, and a conductive adhesive is applied to the surface to which heat is transferred.

Consequently, there is a characteristic such that when the mounting surface of the base is of a high temperature, heat generated by a heat generating component is transferred to the cover side, and heat dissipation can be carried out from the surface of the cover.

The base 110 is molded from a conductive metal material or processed from sheet metal, the circuit substrate 130 further includes the third heat generating component 135*b* added to the back surface side, and heat generated by the third heat generating component 135*b* is transferred to the base 110 via the silicone resin series second heat transfer adhesive 135*bb* including a conductive material applied to the inner surface of the base 110.

As heretofore described, in connection with claim 5 of the invention, heat generated by the third heat generating component mounted on the back surface side of the circuit substrate is transferred to the inner surface of the base made of a metal material, and a conductive adhesive is applied to the surface to which heat is transferred.

Consequently, when the base side is of a lower temperature than the cover side, a rise in the temperature of the third heat generating component can be restricted more advantageously than the heat being transferred to the cover side, and even when the base side is of a higher temperature than the cover side, the temperature of the third heat generating component, which opposes and neighbors the base and whose ambient temperature is high, becomes higher still due to a rise in the temperature of the third heat generating component itself being added, because of which there is a characteristic such that transferring heat to the base via a conductive adhesive can restrict temperature rise more than when heat is not transferred.

The base 110 is molded from a conductive metal material or processed from sheet metal, the first sealing material, or the first sealing material and second sealing material, are a silicone resin series adhesive with low thermal conductivity that does not include a conductive material, and the adhesives are of a resin material with thermal conductivity lower than that of the first heat transfer adhesives 126 and 127 or second heat transfer adhesive 135*bb*.

As heretofore described, in connection with claim 6 of the invention, an adhesive sealing material with thermal conductivity lower than that of a heat transfer adhesive applied between a heat generating component and a heat transfer pedestal is used for the second sealing material provided on the joining surfaces of the base and cover.

Consequently, when the mounting surface of the base is of a high temperature, there is a characteristic such that the amount of heat transferred from the mounted surface to the cover via the base is restricted, and increase of the ambient temperature in the frame can be restricted.

The base 110 is processed by molding using a thermosetting resin having strength in high temperature. As heretofore described, in connection with claim 7 of the invention, the base is molded using a thermosetting resin.

Consequently, when the mounting surface of the base is of a high temperature, there is a characteristic such that the amount of heat transferred from the mounted surface to the cover via the base is restricted, and increase of the ambient temperature in the frame can be further restricted.

Various modifications and alterations of the invention will be apparent to those skilled in the art without departing from the scope and spirit of the invention, and it should be understood that this is not limited to the illustrative embodiments set forth herein.

What is claimed is:

1. A waterproof electronic equipment unit comprising, with respect to a mounted surface including a flat mounting portion and mounting surface depressed portion, a base fixed by screwing to the flat mounting portion, a frame configured of the base and a metal cover, a circuit substrate hermetically housed in the frame, a resin connector housing, mounted on one side of the circuit substrate, of which one portion is exposed from an end face aperture of the frame, and a plurality of connection terminals fixed to a body portion of the connector housing, one end of the connection terminal being connected to a circuit pattern of the circuit substrate, and another end being in conductive contact with a connection terminal of a mating side connector, wherein the mounted surface, to which mounting legs provided on the base are fixed by screwing, has the mounting surface depressed portion in one region of the flat mounting portion, the base includes a base depressed portion fitted and disposed in the mounting surface depressed portion across a depressed portion gap, the connector housing, or the connector housing and a high component mounted on the circuit substrate, is disposed in the base depressed portion, an inlet of a water-repellent filter fixed to an inner surface of the base is provided in a non-depressed portion of the base, an outer plane of the inlet is disposed opposing the flat mounting portion across an intake surface gap, the water-repellent filter is of a flat porous material including a plurality of minute holes that allow air to pass freely through and prevent water droplets from flowing into and passing through an interior of the frame, a height dimension of the mounting legs when a depth of the mounting surface depressed portion is greater than a depth of the base depressed portion is set so as to be a value greater than a height of a flow of water flowing onto an outer surface of the base when carrying out a water exposure test in accordance with a predetermined specification as the intake surface gap, the height dimension of the mounting legs is determined so that an outer surface of the base depressed portion does not come into contact with the mounting surface depressed portion when the depth of the mounting surface depressed portion is smaller than the depth of the base depressed portion, and the inlet of the water-repellent filter is positioned higher in a vertical direction than a spatial region included in the mounting surface depressed portion.

2. The waterproof electronic equipment unit according to claim 1, wherein when the mounting legs of the base are attached and fixed onto the mounted surface, which forms a floor surface, an angle of inclination θ is provided for the flat mounting portion, and the angle of inclination θ is an angle inclined in a direction such that water flowing into a gap between aback surface of the base and the flat mounting portion flows in the direction of the mounting surface depressed portion.

3. The waterproof electronic equipment unit according to claim 1, wherein a three-sided recessed strip is provided on three sides of an outer peripheral portion of the inner surface of the base, a depressed surface sealing portion to which a first sealing material is applied is provided in the end face aperture in which trapezoidal inclined sides and a short apex are configured by the base depressed portion, one end of the plurality of connection terminals fixed to the body portion of the connector housing is bent at a right angle and connected to the circuit pattern of the circuit substrate, a three-sided flat sealing portion configuring the both inclined sides and a short apex of a trapezoidal form fitted into the end face aperture, and a recessed strip sealing portion provided in a long bottom side of the trapezoidal form, are configured on an outer peripheral surface of the body portion, an annular projecting strip is provided on four sides on an outer peripheral portion of an inner surface of the cover, an annular recessed strip to which a second sealing material is circularly applied is configured by the three-sided recessed strip and recessed strip sealing portion, and the annular projecting strip is fitted into the annular recessed strip.

4. The waterproof electronic equipment unit according to claim 3, wherein the cover is molded from a conductive metal material or processed from sheet metal, one or both of a back surface side first heat generating component and front surface side second heat generating component are mounted on the circuit substrate, the first heat generating component is mounted on the substrate back surface opposing the base, heat generated by the heat generating component is transferred to a high stage heat transfer pedestal provided on the cover via a substrate front surface side flat surface pattern linked by a plating through hole provided in the circuit substrate, the second heat generating component is mounted on the substrate front surface opposing the cover, heat generated by the heat generating component is transferred to the inner surface of the cover or to an intermediate stage heat transfer pedestal, silicone resin series first heat transfer adhesives including a conductive material are applied to the intermediate stage or high stage heat transfer pedestal, and a maximum value of an ambient surface temperature of the cover is equal to or lower than a maximum ambient temperature of the mounted surface.

5. The waterproof electronic equipment unit according to claim 4, wherein the base is molded from a conductive metal material or processed from sheet metal, the circuit substrate further includes a third heat generating component added to the back surface side, and heat generated by the third heat generating component is transferred to the base via a silicone resin series second heat transfer adhesive including a conductive material applied to the inner surface of the base.

6. The waterproof electronic equipment unit according to claim 5, wherein the first sealing material, or the first sealing material and second sealing material, are a silicone resin series adhesive with low thermal conductivity that does not include a conductive material, and the adhesives are of a resin material with thermal conductivity lower than that of the first heat transfer adhesives or second heat transfer adhesive.

7. The waterproof electronic equipment unit according to claim 4, wherein the base is processed by molding using a thermosetting resin having strength in high temperature.

* * * * *